United States Patent
Osame et al.

(10) Patent No.: US 7,589,698 B2
(45) Date of Patent: Sep. 15, 2009

(54) DISPLAY DEVICE, SEMICONDUCTOR DEVICE, AND ELECTRONIC DEVICE

(75) Inventors: Mitsuaki Osame, Kanagawa (JP); Aya Anzai, Kanagawa (JP); Yu Yamazaki, Tokyo (JP); Tamae Takano, Kanagawa (JP); Takashi Hamada, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 629 days.

(21) Appl. No.: 10/801,542

(22) Filed: Mar. 17, 2004

(65) Prior Publication Data

US 2004/0238831 A1    Dec. 2, 2004

(30) Foreign Application Priority Data

Mar. 17, 2003   (JP)   .............. 2003-072412

(51) Int. Cl.
*G09G 3/30* (2006.01)
(52) U.S. Cl. .............. 345/76; 345/39; 345/92; 345/204; 345/205; 345/206
(58) Field of Classification Search .......... 345/76, 345/39, 92, 204–206
See application file for complete search history.

(56) References Cited

U.S. PATENT DOCUMENTS

| | | | |
|---|---|---|---|
| 5,229,310 A * | 7/1993 | Sivan | 438/156 |
| 5,953,595 A * | 9/1999 | Gosain et al. | 438/158 |
| 6,365,933 B1 | 4/2002 | Yamazaki et al. | |
| 6,451,636 B1 * | 9/2002 | Segawa et al. | 438/166 |
| 6,590,230 B1 | 7/2003 | Yamazaki et al. | |
| 6,593,691 B2 | 7/2003 | Nishi et al. | |
| 6,670,773 B2 * | 12/2003 | Nakamura et al. | 315/169.3 |
| 6,909,240 B2 | 6/2005 | Osame et al. | |
| 6,930,328 B2 | 8/2005 | Kimura et al. | |
| 7,113,154 B1 | 9/2006 | Inukai | |
| 2002/0047581 A1 | 4/2002 | Koyama | |
| 2003/0089905 A1 | 5/2003 | Udagawa et al. | |
| 2007/0176176 A1 | 8/2007 | Yamazaki et al. | |

FOREIGN PATENT DOCUMENTS

| | | |
|---|---|---|
| JP | 10-229202 | 8/1998 |
| JP | 11-194363 | 7/1999 |
| JP | 2001-147659 | 5/2001 |
| JP | 2001-236027 | 8/2001 |
| JP | 2001-343933 | 12/2001 |

* cited by examiner

*Primary Examiner*—Richard Hjerpe
*Assistant Examiner*—Leonid Shapiro
(74) *Attorney, Agent, or Firm*—Nixon Peabody LLP; Jeffrey L. Costellia

(57) ABSTRACT

When an electrical characteristic of the TFT varies, display unevenness such as brightness unevenness or gradation unevenness is occurred in a display image. According to the present invention, a display device in which variation of an electrical characteristic of a TFT is reduced, and display unevenness is reduced is provided. To obtain the display device, the fluctuation ratio of ON current value in a saturation region of adjacent TFTs is set to be equal to or less than ±12% in a TFT array substrate in which a plurality of TFTs are arranged.

22 Claims, 12 Drawing Sheets

ON current value fluctuation in adjacent TFTs[%]

scanning direction of laser beam 5607
5624
5630 scanning direction of laser beam 5635
5630
5620

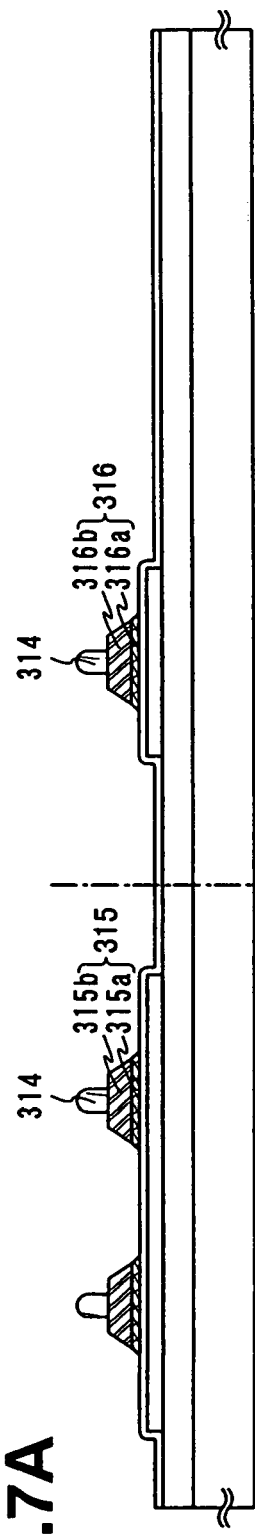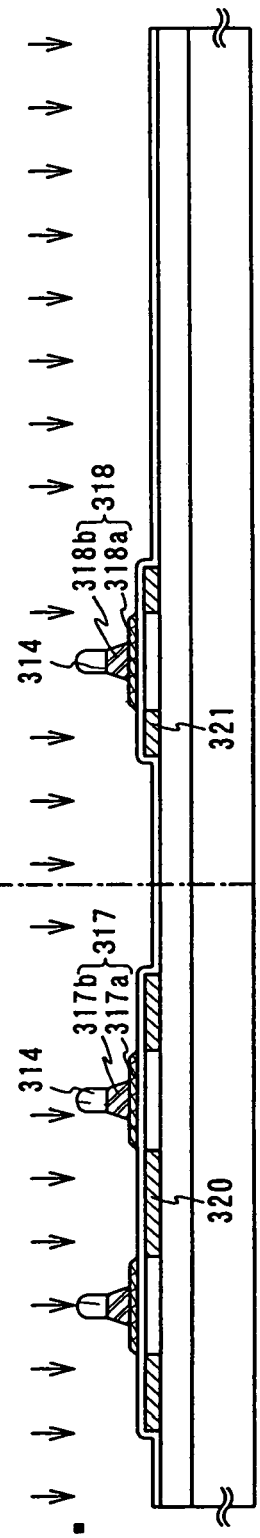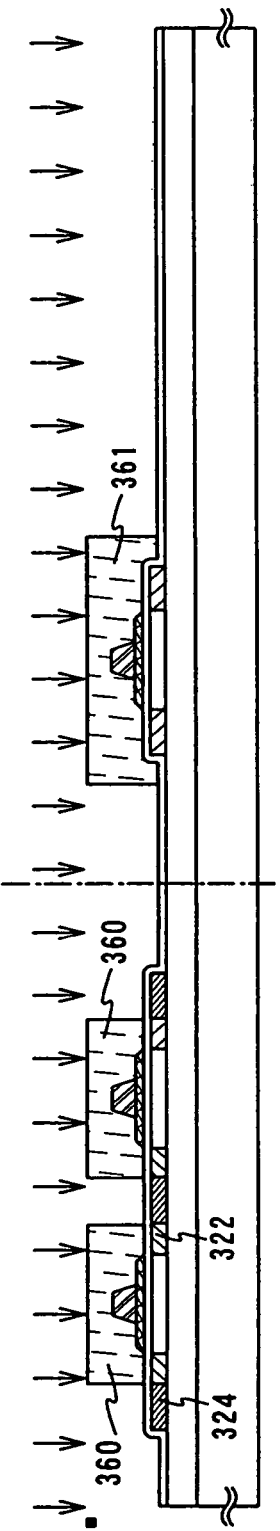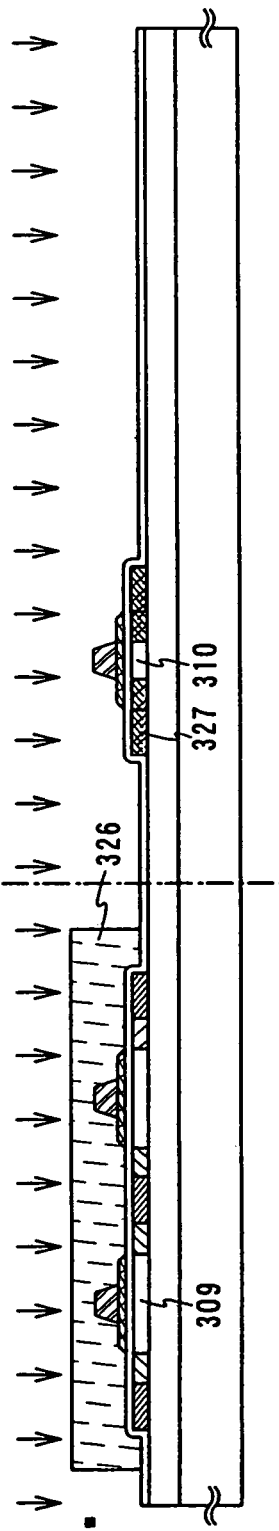

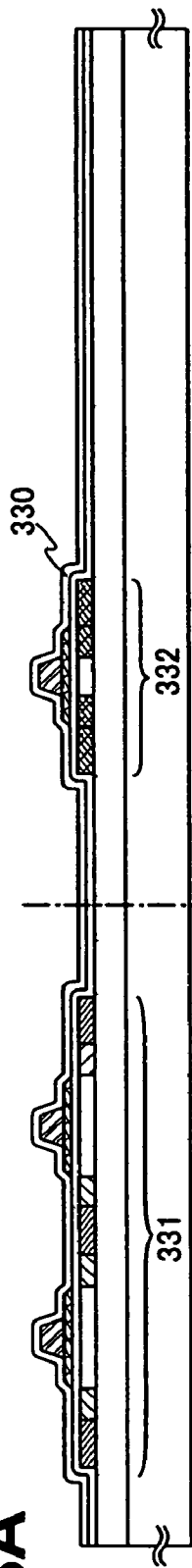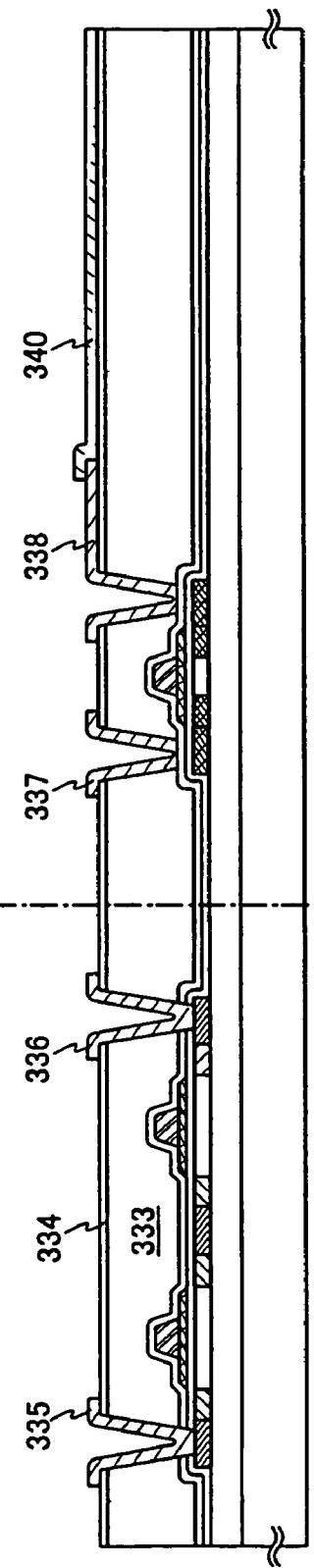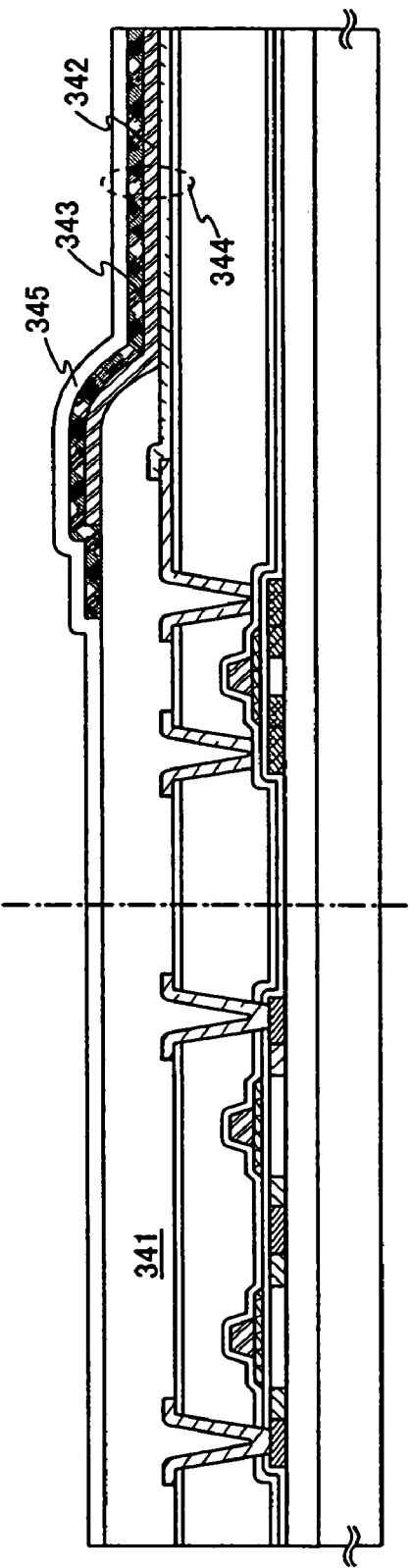

DISPLAY DEVICE, SEMICONDUCTOR DEVICE, AND ELECTRONIC DEVICE

BACKGROUND OF THE INVENTION

1. Field of the Invention

The present invention relates to a display device and a semiconductor device. Specifically, the present invention relates to a display device and a semiconductor device having a semiconductor layer formed by laser beam irradiation.

2. Description of the Related Art

As an element for driving an EL (Electro Luminescence) display device and the like, a thin film transistor (hereinafter referred to as a TFT) is used.

A low temperature process with the use of a glass substrate has been developed for the purpose of manufacturing a TFT in lower cost. In low temperature process, crystallization with the use of a laser beam is generally utilized as a method for manufacturing a crystalline semiconductor film used as a barrier layer of the TFT.

In the TFT manufactured according to the method described above, variation also occurs in an electrical characteristic of the TFT when variation occurs in a laser irradiation condition.

When the electrical characteristic of the TFT varies, there are problems that display unevenness such as brightness unevenness or gradation unevenness occurs in a display image.

SUMMARY OF THE INVENTION

It is an object of the present invention to reduce electrical characteristic variation of a TFT and provide a display device in which display unevenness is reduced.

The display device of the present invention comprises a TFT array substrate wherein the fluctuation rate of ON current value in a saturation region of adjacent TFTs is at most ±12%.

In a display device where emission brightness is fluctuated depending upon ON current value that flows in a saturation region of Vd-Id (drain voltage—drain current) characteristic, the emission brightness is changed in proportion to difference in ON current value of the adjacent TFTs.

Accordingly, when the difference in the ON current value of the adjacent TFTs is reduced, fluctuation of emission brightness can be reduced, further, display unevenness in a display image can be reduced.

As a means for showing difference of the ON current value, there are an absolute value of difference in ON current of the adjacent TFTs and fluctuation rate of ON current value of the adjacent TFTs.

When each the ON current value of the adjacent TFTs is assumed to be $I_{(A)}$ and $I_{(B)}$, the absolute value of difference in the ON current of the adjacent TFTs is expressed in $|I_{(B)}-I_{(A)}|$ (A).

In addition, when the ON current value of the adjacent TFTs is to be $I_{(A)}$ and $I_{(B)}$ respectively, the fluctuation rate of ON current value in the saturation region of the adjacent TFTs is expressed in $(I_{(B)}-I_{(A)})/I_{(A)} \times 100$ (%).

As the difference in ON current value of the adjacent TFTs becomes smaller, the absolute value of the change of the emission brightness becomes smaller, and display unevenness is reduced.

In addition, even if the fluctuation rate of ON current value of adjacent TFTs is small, fluctuation of emission brightness becomes smaller, and display unevenness is reduced.

The absolute value of difference in ON current value of the adjacent TFTs is preferably at most 0.009 μm. In addition, the fluctuation rate of ON current value of adjacent TFTs is preferably at most ±12%.

In addition, a TFT may be adjacent to the other TFT in any directions of a row direction, a column direction, or a diagonal direction.

BRIEF DESCRIPTION OF THE DRAWINGS

FIGS. 7A to 7D are diagrams showing a method for manufacturing a display device of the present invention;

FIGS. 8A to 8C are diagrams describing a method for manufacturing a display device of the present invention.

DETAILED DESCRIPTION OF THE INVENTION

Embodiment Mode

Hereinafter, an embodiment mode of the present invention is described with reference to the drawings. However, the present invention can be carried out in many different modes. And it is easily understood by those skilled in the art that the mode and the detail of the present invention can be variously changed without departing from the purpose and the scope of the invention. Therefore, the interpretation is not limited to the description of the embodiment mode in the present invention.

An embodiment mode of the present invention is described with reference to FIG. 2A to FIG. 5.

In a display device of the present invention, a plurality of driving TFTs 5607 for driving a light emitting element are arranged in a matrix over a glass substrate 5624.

Figure 2A:
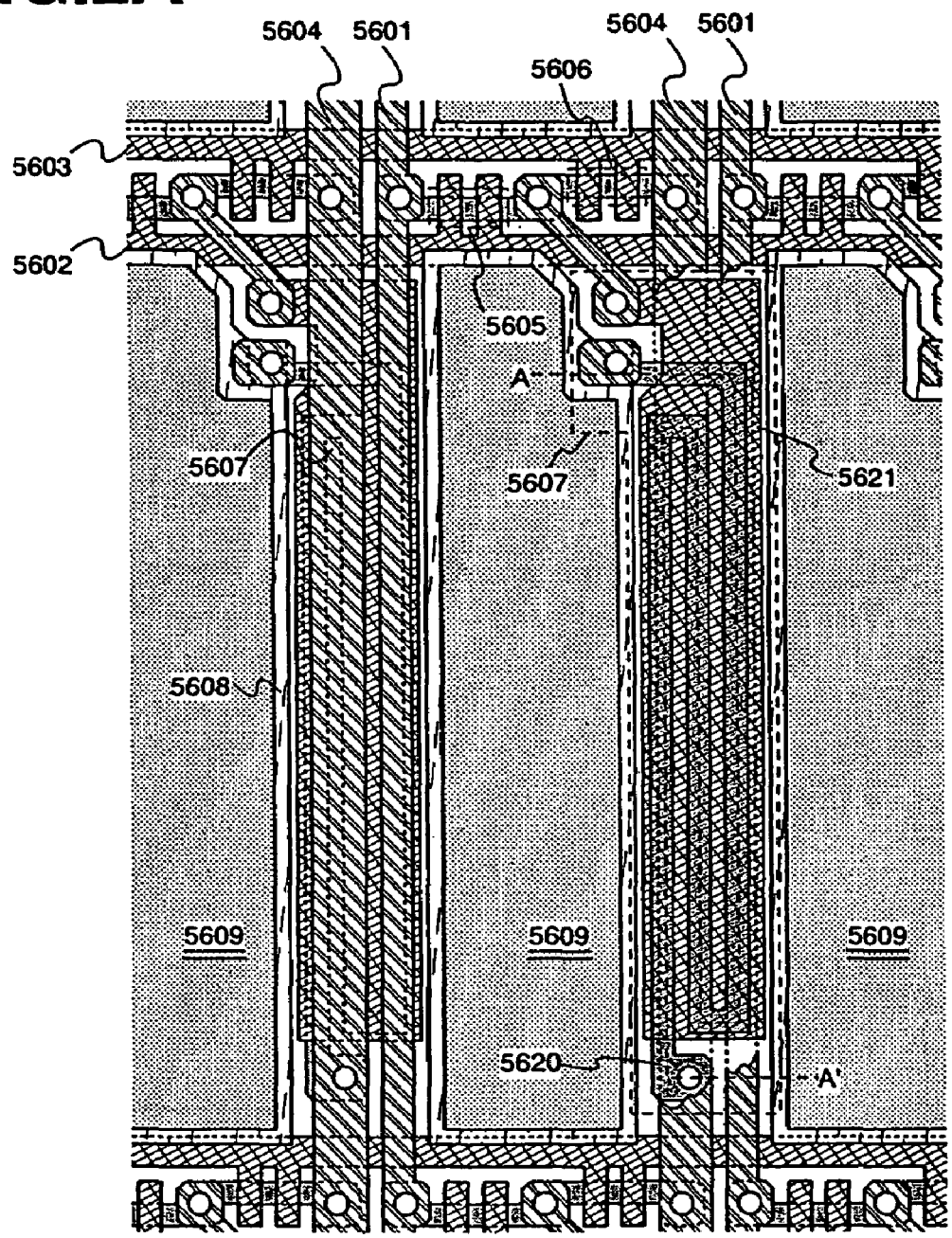
FIGS. 2A and 2B are diagrams showing the present invention.
Figure 2B:
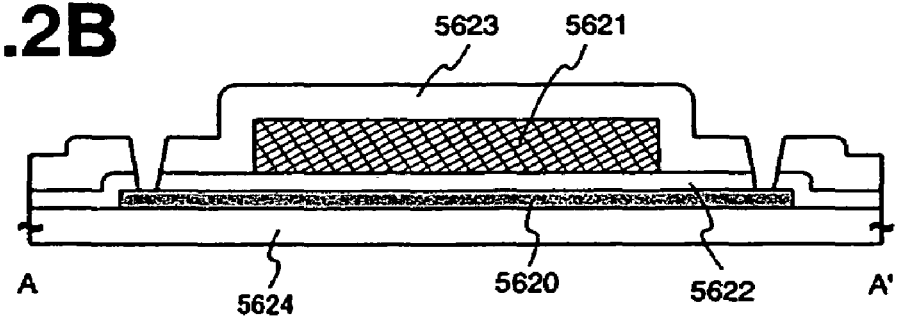

FIG. 2A is a top view of a pixel having the driving TFTs 5607, and FIG. 2B is a cross-sectional view in a cutting plane line A-A' of FIG. 2A. In FIGS. 2A and 2B, reference numeral 5601 denotes a source signal line, 5602 denotes a first gate line, 5603 denotes a second gate line, 5604 denotes a current supply line, 5605 denotes a switching TFT, 5606 denotes an erasing TFT, 5607 denotes a driving TFT, 5608 denotes a pixel electrode (one of electrodes of a light emitting element), 5609 denoted a light emitting area, 5620 denotes a semiconductor layer, 5621 denotes a gate electrode, 5622 denotes a gate insulating film, 5623 denotes an interlayer insulating film, and 5624 denotes a substrate.

In FIG. 2A, in addition to the driving TFT 5607, the switching TFT 5605, and the erasing TFT 5606 are provided in the pixel. The driving TFT 5607 is a p-channel TFT including the semiconductor layer 5620, the gate insulating film 5622, and the gate electrode 5621. In addition, the channel-length has length that is at least 5 times the gate width.

In this embodiment mode, a semiconductor layer 5620 has a meandered shape. Accordingly, a channel of the driving TFT 5607 orientates in a plurality of directions of a column direction and a row direction. Particularly, the channel of the driving TFT 5607 is mostly arranged in column direction.

A structure of the driving TFT 5607 is not limited in particular, and either a single gate structure or a multi gate structure may be used. In addition, either a top gate structure or a bottom gate structure may be used. Further, either a single drain structure, or an LDD structure may be used. As the channel type, either an n-channel type or a p-channel type can be adapted.

The semiconductor layer 5620 is formed by isolating the crystalline semiconductor film which is crystallized by irradiating an amorphous semiconductor film with a pulsed laser beam after forming the amorphous semiconductor film over the glass substrate 5624. In addition, a laser beam is a linear laser beam that is shaped into a linear shape.

Figure 3A:
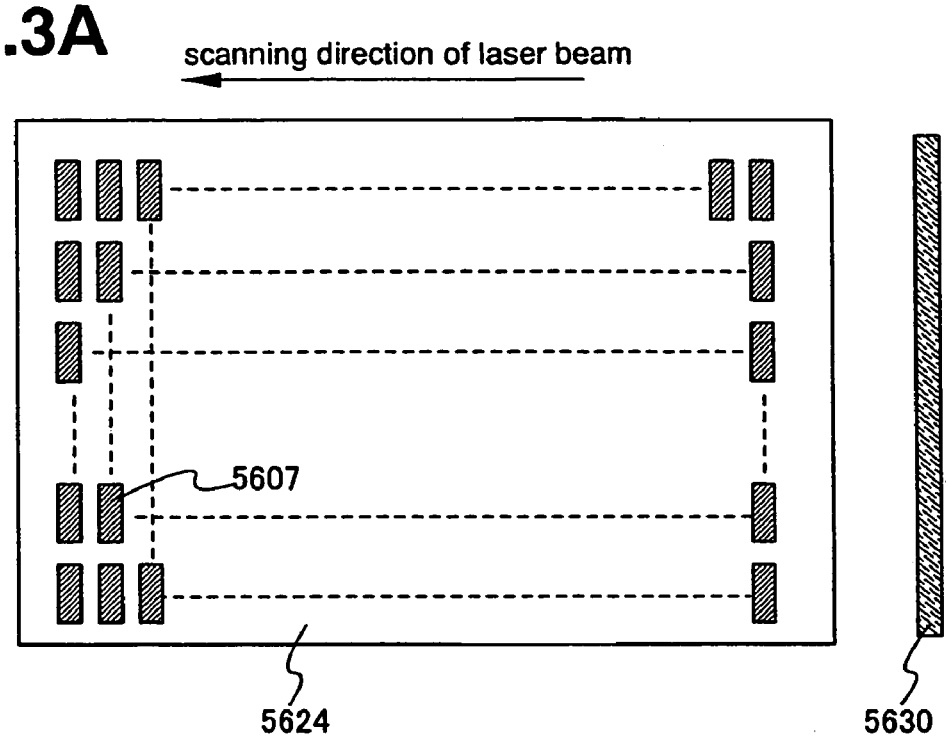
FIGS. 3A and 3B are diagrams showing the present invention.
Figure 3B:
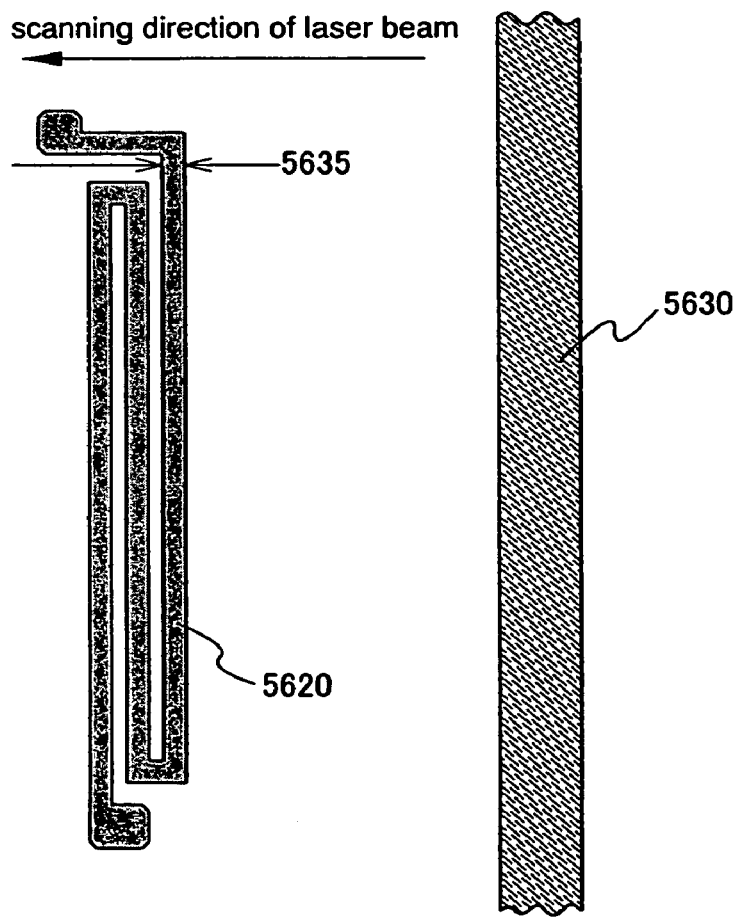

In this embodiment mode, a laser beam is scanned in a row direction so that a longitudinal direction of the laser beam is approximately parallel to the column direction, then an amorphous semiconductor film is irradiated with the laser beam. Thus, as shown in FIG. 3B, the laser beam irradiation is performed so that a superior direction (perpendicular direction to a gate width 5635 in FIG. 3B) is parallel to the longitudinal direction of a laser beam 5630 among a plurality of channel directions in the semiconductor layer 5620.

In addition to a method for irradiating the amorphous semiconductor film with the laser beam as described in this embodiment mode, a crystalline semiconductor film which is crystallized by using a furnace or RTA using a gas (or light) may be further crystallized by irradiating with a laser beam. The laser beam which uses a excimer, a YAG or the like as a medium can be utilized.

Figure 4A:
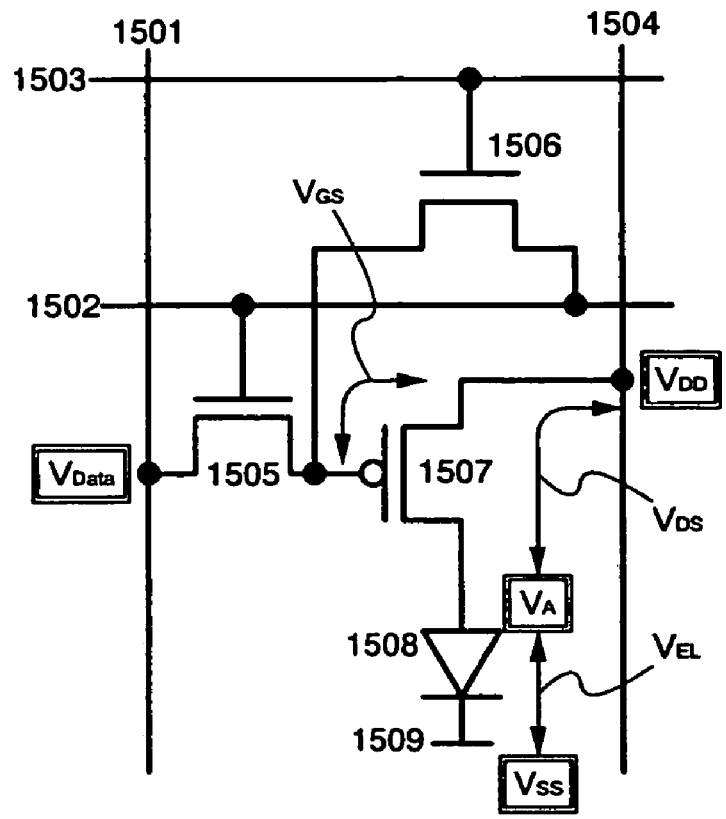
FIGS. 4A and 4B are diagrams showing the present invention.
Figure 4B:
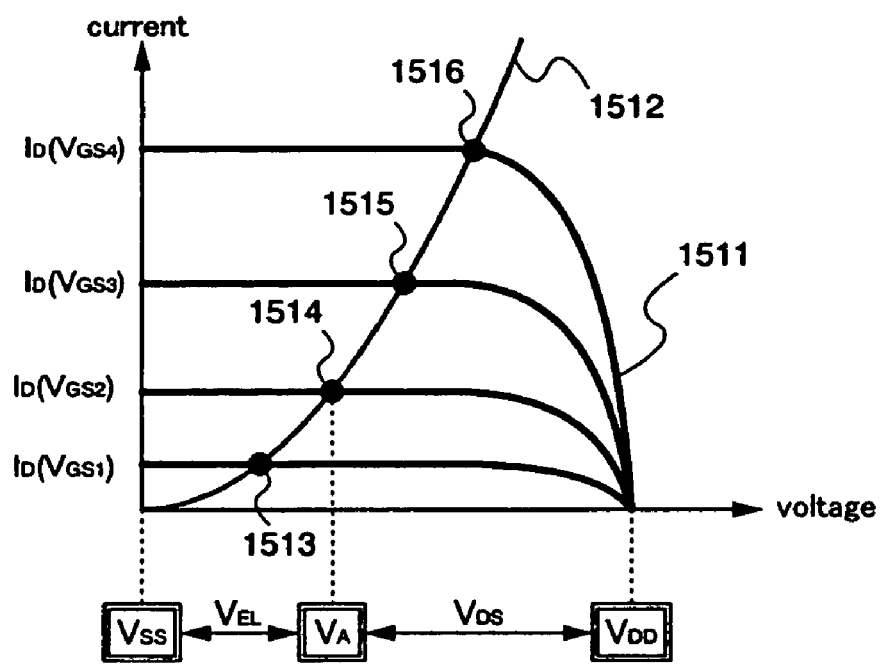

A method for driving a display device of the present invention is described with reference to FIGS. 4A and 4B. In FIG. 4A, reference numerals 1501 denotes a source signal line, 1502 denotes a first gate signal line, 1503 denotes a second gate signal line, 1504 denotes a current supply line, 1505 denotes a switching TFT, 1506 denotes an erasing TFT, 1507 denotes a driving TFT, 1508 denotes a light emitting element (an EL element), and 1509 denotes a counter power supply. In addition, in FIG. 4B, reference numerals 1511 denotes a Vd-Id curve of the driving TFT 1507, 1512 denotes a load curve of an EL, and 1513 to 1516 denote an operating point.

As shown in FIG. 4A, the driving TFT 1507 and the light emitting element 1508 are serially-connected between the current supply line and the counter power supply of each pixel. As for the current which flows to the light emitting element 1508, an intersection of the Vd-Id curve of the driving TFT 1507 and the V-I curve of the light emitting element 1508 is an operating point. Therefore, the current flows according to the voltage between the source and drain of the driving TFT 1507 in the operating point and the voltage between the both electrodes of the light emitting element 1508.

In this embodiment mode, electric potential of a gate electrode of a driving TFT and electric potential of a power line (anode) are adjusted. The voltage ($|V_{GS}|$) between the gate and the source of the driving TFT 1507 is to be smaller than the voltage between the source and the drain ($|V_{DS}|$) by threshold voltage ($V_{th}$) or more, thus the driving TFT 1507 operates in the saturation region.

Figure 5:
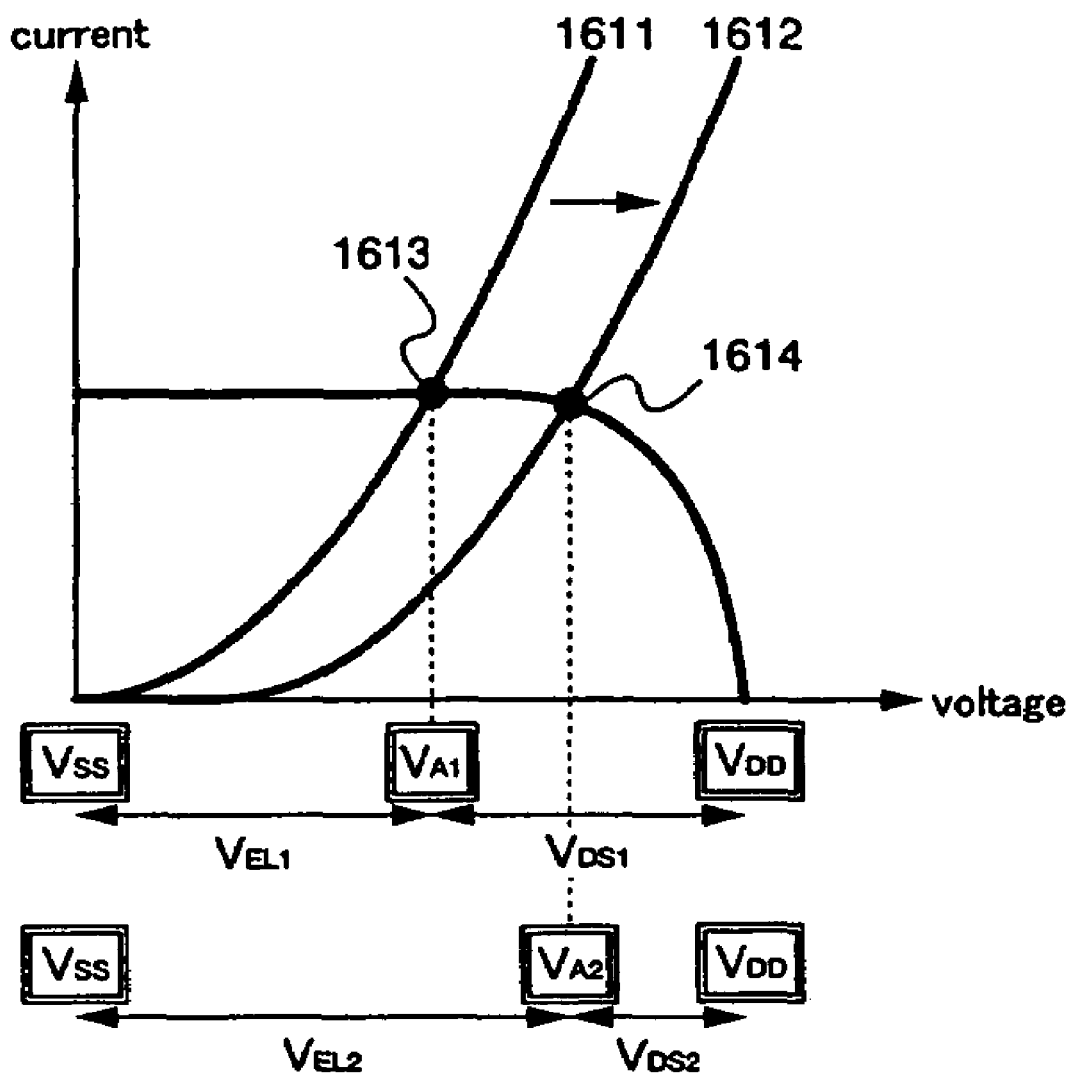
FIG. 5 is a diagram showing the present invention.

When the driving TFT 1507 is operated in the saturation region, as shown in FIG. 5, even if voltage—current characteristic of the light emitting element 1508 varies from the Vd-Id curve 1511 to the load curve 1512 of the EL element due to the degradation of the light emitting element 1508, even if the operating point varies from 1513 to 1514, a certain current flows through the light emitting element 1508 because the drain current ($I_{DS}$) of the driving TFT 1507 is constant. Therefore fluctuation of brightness is smaller compared with when operating the driving TFT 1507 in a linear region.

Thus, in order to reduce display unevenness due to the individual variation of plural driving TFTs, it is important to reduce variation of the drain current value in the saturation region of driving TFT particularly.

In a display device as described above, the fluctuation rate of the ON current value of the adjacent TFTs is at most ±12%. Therefore, in the display device, display unevenness with a striped pattern occurred due to variation in irradiation intensity of a laser beam in particular can be reduced. A TFT may be adjacent to the other TFT in any directions of a row direction, a column direction, or a diagonal direction. In addition, the present invention can be applied to the field emission displays (FED) and the like without being limited to the light emitting device shown in this embodiment mode.

Embodiment 1

In this embodiment, a method for manufacturing a display device of the present invention is described.

For example, a glass substrate such as a barium borosilicate glass and an alumino borosilicate glass, a quartz substrate, a ceramic substrate, and the like can be used for a substrate 301. In addition, a material that an insulating film is formed on the surface of a metal substrate including a SUS substrate or a silicon substrate may be used. A substrate composed of a synthetic resin having flexibility such as plastics generally tends to have lower heat resistance temperature compared with the above described substrate. However, the substrate composed of the synthetic resin, which can withstand the processing temperature in the manufacture step can be used.

Next, a first insulating film 303 is formed so as to cover a first electrode 302. In this embodiment mode, the first insulating film 303 is formed by laminating two insulating films (a first insulating film A303a and a first insulating film B303b). A silicon nitride oxide film (SiNO) is utilized so as to form the first insulating film A303a with a thickness of 50 nm. A silicon oxynitride film is utilized so as to form the first insulating film B303b with a thickness of 100 nm. In addition, the structure of the first insulating film 303 is not limited to the one described above, and may be formed with a single insulating film or at least three-layer insulating films. In addition, the material is not limited to this, too.

Next, an amorphous semiconductor film 304 with a thickness of 54 nm is formed on the first insulating film 303 by plasma-CVD. In addition, the amorphous semiconductor film may be formed by other manufacturing method such as spattering, or vapor deposition. However, it is preferable to sufficiently reduce impurity elements such as oxygen and nitrogen which are included in the film.

Not only the silicon but also silicon germanium can be used for the semiconductor. When the silicon germanium is used, the concentration of the germanium is preferably and approximately 0.01 to 4.5 atomic %.

In addition, when both of the first insulating film 303 and the amorphous semiconductor film 304 are manufactured by plasma-CVD, they may be formed in succession without exposing to atmospheric air.

Figures 6A, 6B, 6C, 6D, 6E:
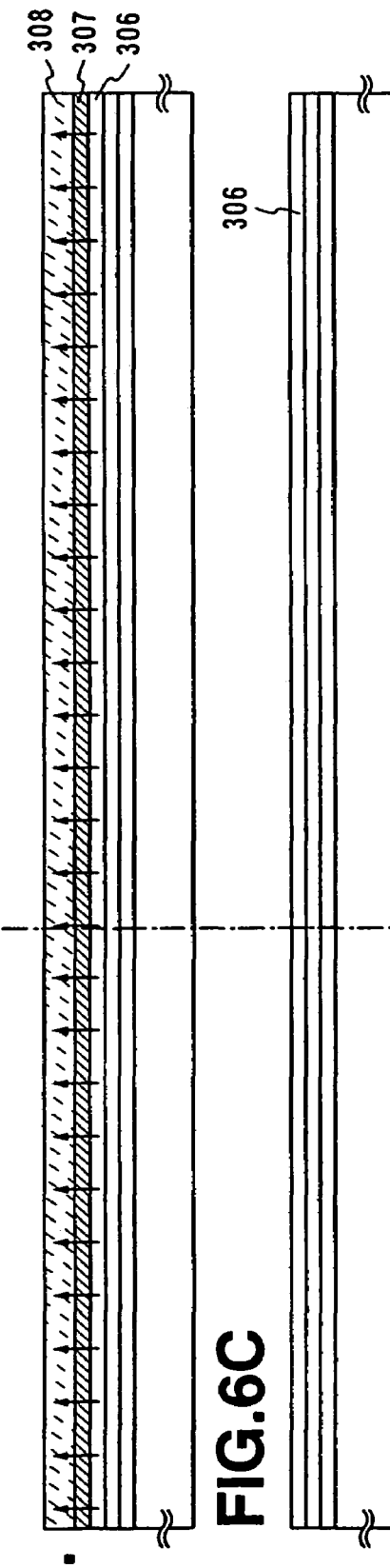
FIGS. 6A to 6E are diagrams showing a method for manufacturing a display device according to the present invention.

Next, a catalyst is doped into the amorphous semiconductor film 304. In this embodiment mode, nickel acetate salt solution including nickel of 10 ppm in weight is applied by a spinner. After forming an ultra thin oxide film by processing the surface of the amorphous semiconductor film 304 with aqueous solution including ozone, and forming a clean surface of the oxide film by etching with a mixture of fluorinated acid and liquid hydrogen peroxide water, the ultra thin oxide film may be formed by again processing with a solution including ozone in order to make better familiarity of nickel acetate salt solution. Because the surface of the semiconductor film is normally hydrophobic property, nickel acetate salt solution can be applied uniformly by forming the oxide film in this way (FIG. 6A).

The catalyst can be doped to the amorphous semiconductor film by not only the method described above, but also by spattering, vapor deposition, plasma treatment, and the like.

Next, the amorphous semiconductor film 304 is crystallized by heat treatment using RTA (Rapid Thermal Anneal) at a monitor preset temperature 750° C. for 180 seconds in order to form a crystalline semiconductor film 306. At this time, hydrogen included in the amorphous semiconductor film 304 is ejected at the same time.

As a method for the heat treatment, a furnace anneal method can be used other than the above mentioned method. In the case of using the furnace anneal method; it is preferable that after ejecting hydrogen by performing the heat treatment at 550° C., the substrate is crystallized by further performing the heat treatment at 550° C. for 4 hours.

In addition to Nickel (Ni) which is used in the present embodiment mode, an element such as germanium (Ge), iron (Fe), palladium (Pd), tin (Sn), lead (Pb), cobalt (Co), platinum (Pt), copper (Cu), or gold (Au) may be used as a catalyst element.

Next, the crystalline semiconductor film 306 may be irradiated with a laser beam, thereby, further improving the crystallinity. In accordance with this embodiment, an excimer laser beam that is a pulsed laser beam having an oscillatory frequency of 30 Hz, a beam width of 476 μm, an energy density (set point) 529 mJ/cm$^2$ is used. A board mounted with the substrate 301 in which the crystalline semiconductor film 306 is formed is moved in drift speed 1 mm/sec, and irradiated with the laser beam for overlap ratio 93.0%. In addition, the irradiation of the first laser beam is performed in the atmosphere including 20% of oxygen and 80% of nitrogen.

A laser beam irradiation is performed so that a superior direction and a longitudinal direction of a laser beam 5630 become parallel to each other among a plurality of channel directions in the semiconductor layer 5620.

Next, gettering of a catalyst element in the crystalline semiconductor film 306 is described. According to the crystallization using the catalyst element, it is conceivable that the catalyst element (here is nickel) is remained in a level of more than $1\times10^{19}$/cm$^3$ for the average density in the crystalline semiconductor film 306. It is necessary to provide a step for reducing the concentration of the catalyst element because there are possibilities to give adverse effect to the TFT characteristic when the catalyst element is remained.

The gettering can be performed in various methods. In this embodiment, the gettering is performed before patterning the crystalline semiconductor film 306. At first, a barrier layer 307 is formed on the surface of the crystalline semiconductor film 306 as shown in FIG. 6B. The barrier layer 307 is provided so as to prevent the crystalline semiconductor film 306 from being etched when removing a gettering site later.

The thickness of the barrier layer 307 is to have a thickness of approximately 10 nm. A chemical oxide formed by treating with ozone water may be used as a barrier layer. In addition, the chemical oxide can be formed similarly when treating the surface of the crystalline semiconductor film 306 with the aqueous solution which is made of mixing sulfuric acid, hydrochloric acid, nitric acid, and the like with hydrogen peroxide water. In addition, a method to treat the crystalline semiconductor film 306 by plasma in oxygen atmosphere or a method to process with oxygen by generating ozone by ultra-violet irradiation in atmosphere including oxygen may be used. Further, a thin oxide film may be formed by heating at approximately 200 to 350° C. using clean oven in order to form a barrier layer over the surface of the crystalline semiconductor film 306. Furthermore, the barrier layer may be formed by accumulating an oxide film to a thickness of approximately 1 to 5 nm by plasma-CVD, spattering, vapor deposition and the like. In either case, a film wherein a catalyst element can move to the gettering site side in a gettering step, and into which etchant does not soak (a film which protects the crystalline semiconductor film 306 from the etchant) in a removal step of gettering site, for example, a chemical oxide film formed by being processed in ozone water, a silicon oxide film (SiOx), or a porous film, may be used.

Subsequently, over the barrier layer 307, a semiconductor film (typically, amorphous silicon film) for gettering which includes a rare gas element with a concentration of at least $1\times10^{20}$/cm$^3$ within the film is formed with a thickness of 50 nm by spattering as the gettering site 308. A film with a lower density is preferably formed as the gettering site 308 in order to increase a selection ratio of the crystalline semiconductor film 306 and etching.

In addition, because the rare gas element itself is inactive in the semiconductor film, adverse effect is not given to the crystalline semiconductor film 306. In addition, one or a plural kind of the element chosen from helium (He), neon (Ne), argon (Ar), krypton (Kr), or xenon (Xe) is used as the rare gas element.

Next, gettering is carried out by giving heat treatment (FIG. 6(B)). The heat treatment is carried out at set temperature of 750° C. for 180 seconds using RTA method. When using furnace anneal method, the heat treatment is performed at 450° C. to 600° C. for 0.5 to 12 hours in the nitrogen atmosphere.

After the step of gettering, the gettering site 308 is etched selectively so as to being removed. For the method of etching, dry etching by ClF$_3$ without using plasma or wet etching using alkaline solution such as aqueous solution including hydrazine and tetraethylammonium hidrooxide ((CH$_3$)$_4$NOH) can be noted. The barrier layer 307 functions as an etching stopper. Subsequently, the barrier layer 307 is removed by fluorinated acid (FIG. 6(C)).

Next, impurities are doped to control the threshold value of the TFT. According to this embodiment, boron that is a p-type impurity is doped.

Next, the crystalline semiconductor film 306 is patterned so as to form an island shape semiconductor films 309 and 310. (FIG. 6D)

Then, a silicon oxide film for covering the semiconductor films 309 and 310 is formed with a film thickness of 115 nm, thereby forming a second insulating film 311. In dry etching for forming the second electrode later, since the film thickness of the second insulating film 311 is decreased, the film thickness is preferably set taking the decrease into account.

For example, silicon oxide, silicon nitride, silicon nitride oxide, or the like can be used to the second insulating film 311. According to this embodiment mode, a second insulating film 311 is formed with a single insulating film, however the second insulating film may be formed with plural insulating films having at least two-layer. In addition, as the formation method, plasma-CVD, spattering and the like can be used. For example, when the second insulating film 311 is formed of silicon oxide by using plasma-CVD, the second insulating film is formed by using a mixed gas of TEOS (Tetraethyl Orthosilicate) and $O_2$, and setting reaction pressure at 40 Pa, substrate temperature at 300° C. to 400° C., high frequency (13.56 MHz) power density at 0.5 to 0.8 $W/cm^2$.

In addition, aluminum nitride can be used for the second insulating film 311. The aluminum nitride comparatively has high thermal conductivity, and can radiate the heat generated in the TFT efficiently. In addition, after silicon oxide or the silicon oxynitride which do not include aluminum is formed, the lamination of the aluminum nitride may be used for the second insulating film 311.

Next, a conductive film is formed over the second insulating film 311 (FIG. 6E). A first conductive film 312a including TaN is formed with a thickness of 30 nm, and a second conductive film 312b including W is formed with a thickness of 370 nm. Concretely, TaN used for the first conductive film is formed by using Ta of purity 99.99% into the target, setting the temperature in the chamber at a room temperature, setting the flow rate of Ar at 50 ml/min, setting the flow rate of $N_2$ at 10 ml/min, setting the pressure in chamber at 0.6 Pa, setting deposition electric power at 1 kW, and setting deposition rate at approximately 40 nm/min. In addition, W used for the second conductive film is formed by using W of purity 99.99% into the target, setting the temperature in the chamber at 230° C., setting the flow rate of Ar at 100 ml/min, setting the pressure in chamber at 1.5 Pa, setting deposition electric power at 6 kW, and setting deposition rate at approximately 390 nm/min.

In addition, in this embodiment mode, an example of forming the second electrode by using two-layer conductive films is described, however the conductive film may be formed with a single layer or plural layers including at least three layers. In addition, a material of each conductive layer is not limited to the material shown in this embodiment mode. Concretely, each conductive film can be formed of an element chosen from Ta, W, Ti, Mo, Al, or Cu, or the alloy or the compound that are based on the above-mentioned element. For example, it is conceivable that the combination that the first layer is TaN and the second layer is Al, or the first layer is TaN and the second layer is Cu. In addition, Ag—Pd—Cu alloy may be used in either the first layer or the second layer. It may be the three-layer structure in which W, Al—Si alloy, and TiN are sequentially laminated. Tungsten nitride may be used instead of using W, and Al—Ti alloy film may be used instead of using the Al—Si alloy, and Ti may be used instead of using TiN. However, when a plurality of conductive films are layered, and difference is to be given in width of each channel-length direction of the each layer's conductive film after etching, the material from which selection ratio of etching can be taken is used.

In addition, it is important to choose a proper etching gas in accordance with the material of the conductive film.

Next, a mask 314 is formed, and the first conductive film 312a and the second conductive film 312b are etched as shown in FIG. 7A (a first etching). The first conductive film 312a and the second conductive film 312b are etched by ICP (Inductively Coupled Plasma) etching in this embodiment mode. The gas mixed with $Cl_2$, $CF_4$ and $O_2$ is used as an etching gas, and the pressure in chamber is set to 1.0 Pa. And, high frequency (13.56 MHz) power of 500W is provided into an electric coil-shaped electrode, thus generating plasma. In addition, high frequency (13.56 MHz) power of 150W is provided into a stage (lower part of the electrode) on which substrate is mounted. Accordingly, self-bias voltage is applied to the substrate. Afterwards, the etching gas is changed to $Cl_2$ and $CF_4$, and the total pressure is set to 1.0 Pa. In addition, high frequency (13.56 MHz) power of 500W is provided with the electric coil-shaped electrode, and high frequency (13.56 MHz) power of 20W is provided with the substrate side (sample stage).

When $CF_4$ and $Cl_2$ are used as the etching gas, etching rate of TaN which is the first conductive film 312a and etching rate of W which is the second conductive film 312b become approximately equal, and the films are etched at the same level.

A first shape conductive film 315 composed of a lower layer 315a and an upper layer 315b, and a first shape conductive film 316 composed of a lower layer 316a and an upper layer 316b is formed by the first etching. In addition, in the first etching, side surfaces of the lower layers 315a and 316a, and the upper layers 315b and 316b become a taper shape to some degree. When the conductive films are etched so as not to leave a residue of the conductive films, there is a case that the surface of the second insulating film 311 which is not covered with the first shape conductive films 315 and 316 is etched approximately equal to or more than 5 nm to 10 nm.

Next, the first shape conductive films 315 and 316 are etched (a second etching) using a mask 314 that the surface thereof is etched by the first etching, and the width thereof becomes small as shown in FIG. 7B. The ICP etching is used in the second etching as well as in the first etching. The gas in which $SF_6$, $Cl_2$, and $O_2$ are mixed is used as the etching gas, and the pressure of the etching gas in a chamber is set to be 1.3 Pa. And, high-frequency (13.56 MHz) power of 700W is applied to the coil-shaped electrode, thus generating plasma. In addition, high-frequency (13.56 MHz) power of 10W is applied to a stage (lower part of the electrode) on which the substrate is mounted, thus self-bias voltage is applied to the substrate.

The etching rate of the W is increased by adding $O_2$ to the gas in which $SF_6$ and $Cl_2$ are mixed. Accordingly, the selection ratio can be obtained since the etching rate of TaN forming the lower layers 315a and 316a of the first shape conductive films 315, and 316 is extremely decreased.

The second shape conductive film 317 (lower layer is to be 317a and upper layer is to be 317b) and the second shape conductive film 318 (lower layer is to be a 318a, and upper layer is to be a 318b) are formed by the second etching. The width in the channel-length direction of the upper layers 317b and 318b becomes shorter than that of the lower layers 317a and 317b. In addition, the surface of the second insulating film 311 which is not covered with the second shape conductive films 317 and 318 is etched approximately equal to or more than 5 nm to 10 nm.

Next, as shown in FIG. 7B, the second shape conductive films 317 and 318 are used as a mask, then, the impurities imparting n-type conductivity are doped to the semiconductor films 309 and 310 (a first doping). As an impurity element imparting n-type conductivity, a group 15 element such as P, As and Sb, which serve as a donor, or a group 16 element such as S, Te, and Se is used. In this embodiment mode, P is used. First impurity regions 320 and 321 are formed in a self-alignment manner by the first doping. The impurity element imparting n-type conductivity is added with a concentration range of $1\times10^{18}$ to $5\times10^{19}$ atoms/cm$^3$ in to the first impurity regions 320 and 321.

Next, as shown in FIG. 7C, one part of the semiconductor film 309 and an entire semiconductor film 310 having an inland-shape are covered with masks 360 and 361 which are formed of a resist, and the second doping is carried out by using the upper layers 317b and 318b of the second shape conductive films 317 and 318 as a mask. Although not shown, impurities are doped through the lower layer of the conducting film having the similar cross-section as that of the second shape conducting layer 317 by the second doping, thus an LDD region overlapped with the conductive layer is formed. In addition, the TFT in which the LDD region overlapped with the conducting layer is formed by this step functions as a drive circuit TFT.

Then, a third doping is carried out with lower acceleration voltage than that in the second doping. A third impurity region 324 which serves as a source or a drain of the TFT is formed by the third doping. In addition, in a semiconductor film 309, impurities are not doped in the region covered with the mask 360 by the third doping; the region 322 becomes the LDD region of the TFT. The impurity element imparting n-type conductivity is doped in the third impurity region 324 with a concentration range of $1\times10^{19}$ to $5\times10^{21}$ atoms/cm$^3$.

In addition, by making suitable accelerating voltage, the second doping and the third doping are performed in one doping treatment and the low concentration impurity region and the high concentration impurity region can be formed.

Though it is different from this embodiment, the concentration of impurities imparting p-type conductivity may be increased without daringly providing a mask to the island shape semiconductor film 310 in which a p-channel TFT is formed for the purpose of reducing the number of the masks, and polarity of the island shape semiconductor film may be reversed to the p-type.

As shown in FIG. 7D, an n-channel type semiconductor film 309 is covered with a mask 326 formed of a resist; impurities imparting the p-type conductivity are doped to the island shape semiconductor film 310 (a fourth doping). In the fourth doping, the second shape conducting film 318 serves as a mask, and a fourth impurity region 327 where the p-type impurity element is doped to the island shape semiconductor film 310 used for the p-channel type TFT is formed. Ion doping with the use of diborane ($B_2H_6$) is used in this embodiment mode. In addition, in this step, doping is performed for the purpose that concentration of the impurity element imparting p-type conductivity is to be $2\times10^{20}$ atoms/cm$^3$ to $2\times10^{21}$ atoms/cm$^3$.

An impurity region is formed in each island shape semiconductor film by this step.

Next, the island shape semiconductor films 309 and 310, the second insulating film 311, and the silicon oxynitride film covering the second shape conducting layers 317 and 318 are layered with a film thickness of 100 nm, thus forming a first interlayer insulating film 330 (FIG. 8A). An insulating film such as silicon oxide, silicon nitride, silicon oxynitride, which includes silicon in addition to the above can be used for the first interlayer insulating film 330.

Next, heat-treatment at 410° C. for one hour, and hydrogenation are carried out. In addition, in this embodiment, hydrogenation is performed using hydrogen contained within the first interlayer insulating film. In addition to hydrogenation, plasma hydrogenation (hydrogen activated by plasma is used) may be carried out.

According to the serial step, a TFT array substrate in which an n-channel TFT 331 for switching or erasing and p-channel TFT 332 for controlling the current to provide with a light emitting element are formed can be manufactured.

In addition, as for the structure of the each TFT, it is not limited to the one shown in this embodiment, and other structures may be used.

In addition, the plasma etching is not limited to the ICP etching. And for example, ECR (Electron Cyclotron Resonance: electron cyclotron resonance) etching, RIE etching, helicon wave etching, helical resonance etching, pulse modulation etching, other plasma etching can be used.

In addition, a gettering step used in the present invention is not limited to a method shown in this embodiment mode. A catalyst element in the semiconductor film may be reduced by using other methods. For example, as shown in Japanese Patent Laid-Open No. 10-135468 or Japanese Patent Laid-Open No. 10-135469, the catalyst element may be removed by using gettering action of phosphorus.

Next, a non-photosensitive acryl film is layered with a film thickness of 0.8 lm so as to cover the first interlayer insulating film 330, thus forming the second interlayer insulating film 333. More particularly, a silicon nitride film is layered with a film thickness of 100 nm by spattering, and a third interlayer insulating film 334 is layered. In addition to acryl, a resin such as polyimide may be used for the second interlayer insulating film 333. A film where a substance such as moisture and oxygen that promote deterioration of OLED hardly penetrates compared with the other insulating film may be used as the third interlayer insulating film 334, and for example, a DLC film, or a carbon nitride film can be noted.

Subsequently, the second insulating film 311, the first interlayer insulating film 330, the second interlayer insulating film 333 and the third interlayer insulating film 334 are etched, thus forming a contact hole. And, island shape semiconductor films 309 and 310, and wirings 335, 336, 337, and 338 for forming a contact are formed.

Next, while covering the third interlayer insulating film 334 and wirings 335 to 338, a transparent conductive film (in this embodiment, an amorphous indium tin oxide (ITO)) is formed with a film thickness of 110 nm, and then is patterned. Accordingly, an electrode (anode) 340 of a light emitting element connected to a wiring 338 forming a contact with an island shape semiconductor film 310 of a p-channel TFT 332 is formed (FIG. 8B). It is heat-treated at 200° C. for one hour after patterning, thus crystallizing the ITO. In addition to the ITO, the transparent conductive film in which 2% to 20% of zinc oxide (ZnO) is mixed in indium oxide may be used as the electrode 340 of the light emitting element. The electrode 340 of a light emitting element may be polished with method of a porous body of polyvinyl alcohol system or by CMP (Chemical mechanical polishing) so as to flatten the surface. In the case that it is polished with the CMP method, ultraviolet irradiation, oxygen plasma treatment may be carried out to the surface of the electrode 340 of the light emitting element.

Then, an organic resin film 341 used as a bank is formed over the third interlayer insulating film 334. In this embodiment, after positive type photosensitive acryl is formed with a thickness of 1.5 lm, it is exposed and developed, and an organic resin film 341 having an opening portion in a region which is overlapped with an electrode 340 of light emitting element is formed. In addition, the edge in the opening portion of the organic resin film 341 is preferably round shape so that a hole is not generated in a light emitting layer formed later in the edge. Specifically, a curvature radius of the curve which is represented by the cross section of organic resin film 341 in the opening portion is preferably 0.2 lm to 2.0 lm.

In this embodiment, a positive type photosensitive acryl is used, however, a negative type acryl may be used. In addition, an organic resin film 341 may be formed by using resist or photosensitive polyimide. When the organic resin film 341 is formed by using acryl of negative type acryl, the edge in the opening portion becomes S-shape cross-section. It is preferable that a curvature radius of the upper end and the lower end of the opening portion is 0.2 lm to 2.0 lm.

According to the above mentioned structure, favorable coverage of a cathode and a light emitting layer which is formed later can be obtained. Further, a short circuit can be prevented from occurring in the hole where the electrode 340 of a light emitting element and a light emitting layer are formed. In addition, defect called shrink that light emitting areas is decreased can be reduced by relieving stress of the light emitting layer, thus enhancing the reliability.

Before forming a light emitting layer, the heat treatment is performed in vacuum so as to remove oxygen, absorbed moisture, and the like. In this embodiment, the heat treatment is performed at 200° C. for one hour in vacuum. The degree of vacuum is preferably set to be at most $3 \times 10^{-7}$ Torr, if possible, the degree of vacuum is set to be at most $3 \times 10^{-8}$ Torr. And, in the case where the light emitting layer is formed after performing the heat treatment to the organic resin film 341 in vacuum, the reliability can be further enhanced by keeping the vacuum atmosphere just before forming the film.

Next, Alq3 containing 0.3% of dimethyl quinacridon (DMQd) by weight is layered over the electrode 340 of the light emitting element with a film thickness of 37.5 nm, thus forming a light emitting element 342. In the lower part of the light emitting layer 342, CuPc is formed as a hole inject layer with a thickness of 20 nm and α-NPD is formed as a hole transport layer with a thickness of 40 nm, then, in the upper part of the light emitting layer 342, Alq3 is formed as an electron transport layer with a thickness of 37.5 nm.

In addition, the film thickness, material and the like to form the light emitting layer is not limited to those described above. In addition, a plurality of light emitting layers wherein each a lamination structure and each a material are different may be formed to realize multicolor emission. In addition, the light emitting layer may be formed by using an inorganic material other than the organic material which is indicated above.

Next, an electrode (cathode) of the light emitting element 343 is formed. The electrode 343 of the light emitting element is formed by laminating calcium fluoride ($CaF_2$) with a thickness of 1 nm and aluminum (Al—Li) including several percent of Li with a thickness of 200 nm.

Accordingly, a light emitting element 344 in which an electrode 340 of a light emitting element, a light emitting layer 342, and an electrode 343 of the light emitting element are laminated is formed. The electrode 343 of the light emitting element is formed with a film which is not transparent in this embodiment, however, it may be a light emitting element of a both faces emission type or a top face emission type where lighting is possible from cathode side, and in which the electrode 343 of the light emitting element is formed by laminating a transparent thin film including alkaline metal or alkaline earth metal, and an ITO.

A protective film 345 for protecting the light emitting element 344 is formed. In this embodiment, a silicon nitride film is formed by spattering, thus forming the protective film 345. In addition, as well as the silicon nitride film, the protective film may be formed of other materials such as DLC (Diamond like Carbon).

Even more particularly, after a sealing substrate 2004 and a substrate 2010 are pasted together by means of a sealant 2005, an FPC 2009 is attached thereto, thereby manufacturing a display device according to the present invention. In addition, a desiccating agent may be installed in the sealing substrate 2004 in order to prevent the light emitting element from deteriorating due to the contamination of the moisture.

Figure 9:
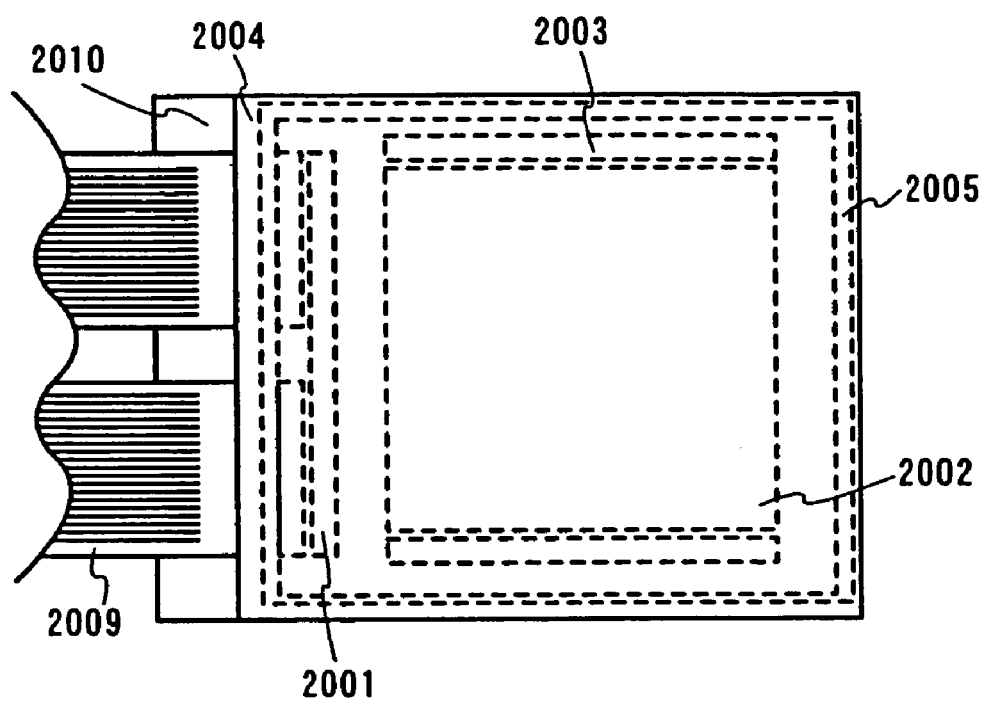
FIG. 9 is a schematic diagram of a module to which the present invention is applied.

FIG. 9 is a top view of a display device according to the present invention. Reference numeral 2001 is a source signal drive circuit, 2002 is a pixel portion, and 2003 is a gate signal drive circuit, which are shown in dotted lines.

Reference numeral 2008 (2008a, 2008b) are wirings to transmit a signal to be input to the source signal drive circuit 2001 and the gate signal drive circuit 2003. The wirings 2008 receive a video signal and a clock signal from an FPC (a flexible print circuit) that is to be an external input terminal 2009. Only the FPC is illustrated here, but a printed wiring board (PWB) may be installed in this FPC.

Figure 10A:
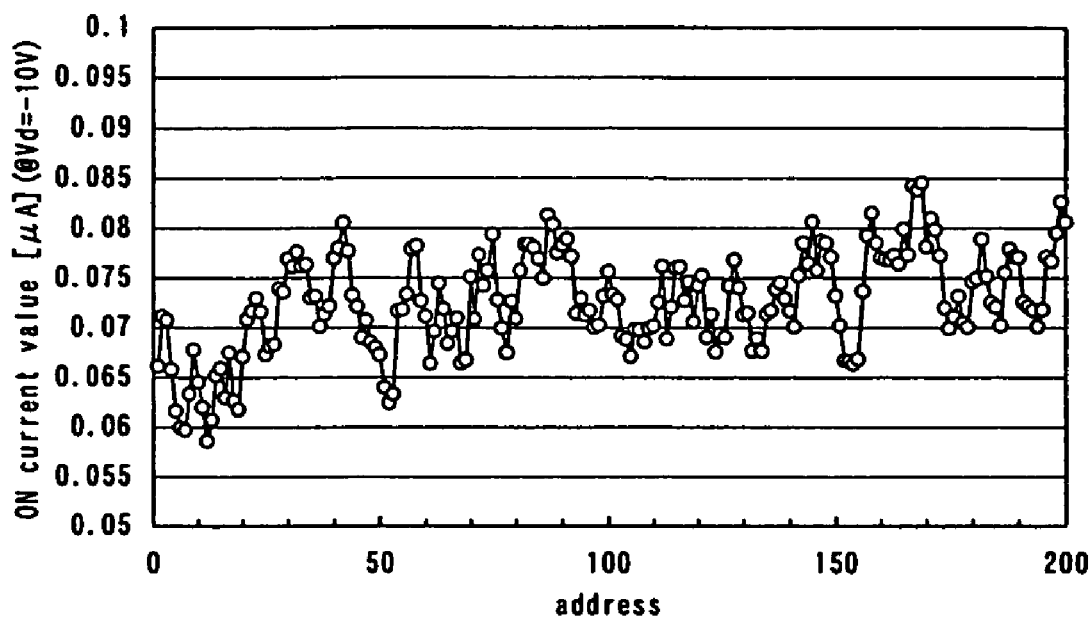
FIGS. 10A and 10B are diagrams showing a relationship of ON current value with a position of a TFT.
Figure 10B:
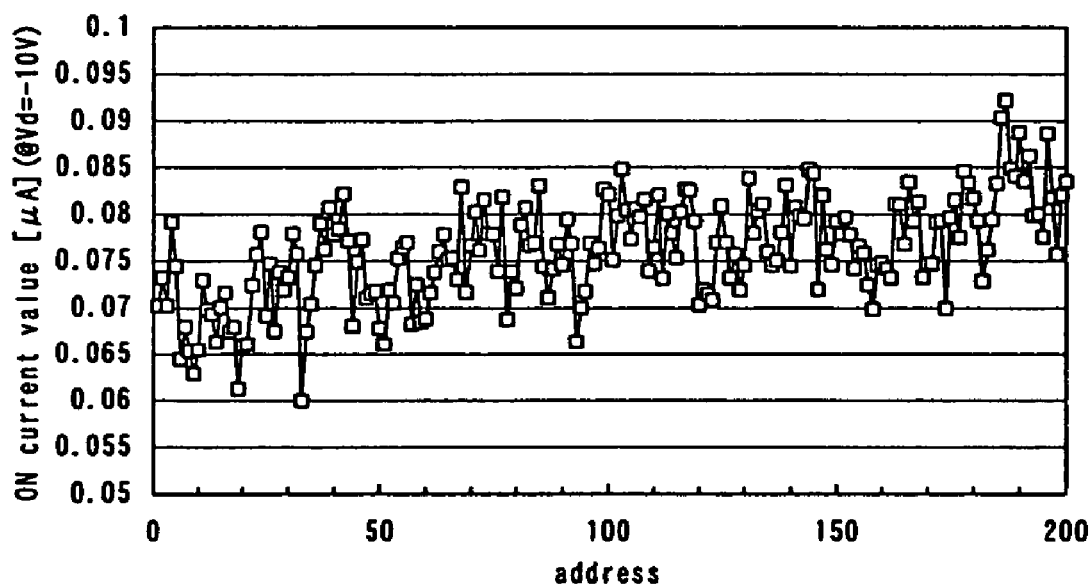

FIGS. 10A and 10B are measurements of the ON current characteristic in a saturation region of plural TFTs arranged in a line in a parallel to the scanning direction of the laser beam in a TFT array substrate. Each the measured TFT is termed an n-th stage TFT according to the order and an address is given thereto respectively. According to FIGS. 10A and 10B, it can be understood how ON current value of the TFT is varied to the TFT address (the position that TFT is formed). FIG. 10A is a data of the TFT in the display device of the present invention, and FIG. 10B is a data of the TFT in the display device manufactured by the conventional technique.

Each the measured TFT has the same structure as the driving TFTs, and each the TFT has 420 μm of the channel-length, and 6 μm of the channel width. The channel type is a p-channel type. In addition, the TFT is arranged with every 63 lm as well as the driving TFT.

In FIG. 10A showing the data according to the present invention, a drain current in the case where the drain voltage and the gate voltage are 10V and 3V respectively is to be ON current value. In FIG. 10B showing the data according to the conventional technique, a drain current in the case where the drain voltage and the gate voltage are 10V and 4.75 V respectively is to be ON current value. A gate voltage value in the present invention is different from that in conventional technique, because the ON current value is adjusted by changing the gate voltage as well as the driving method of the display in order to compare the TFT characteristics when equivalent brightness is provided in the display devices.

Figure 1:
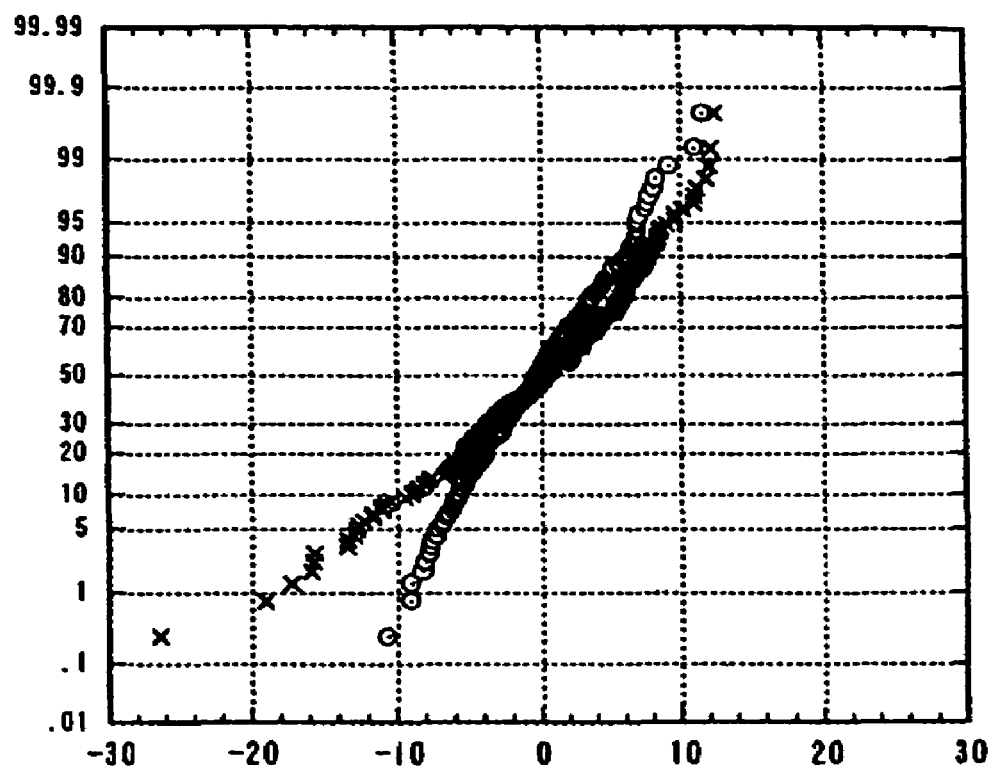
FIG. 1 is a probability distribution graph of ON current value fluctuation in adjacent TFTs.

In addition, FIG. 1 is a diagram showing probability distribution of fluctuation rate of ON current value of adjacent TFTs in display devices manufactured according to the present invention and the conventional technique, which is illustrated according to the data in FIGS. 10A and 10B. It can be understood that the fluctuation rate of adjacent TFTs is smaller in the present invention compared to the one manufactured according to the conventional technique.

Table 1 shows comparison of variation (%) in the entire TFTs with maximum value (%) of the fluctuation rate in the ON current value of adjacent TFTs in display devices manufactured according to the present invention or the conventional technique, and which are illustrated according to the data in FIGS. 10A and 10B.

TABLE 1

| | present invention | conventional technique |
|---|---|---|
| distribution inside face (%) | 6.95 | 7.25 |
| maximum value (%) of fluctuation rate in ON current v (%) | 11.7 | 26.4 |

According to the data, it can be seen that variation of the entire TFTs hardly vary between display devices manufactured according to the present invention and the conventional technique. However, maximum value (%) of the fluctuation rate in the ON current value of adjacent TFTs in the present invention is 11.7% and that in the conventional technique is 26.4%, namely, the former is at least two times smaller than that in the conventional technique. In addition, the maximum of the absolute value of difference in ON current value of adjacent TFTs is 0.00831 A in the present invention, and, 0.0158 1 A in the conventional technique.

Figure 11A:
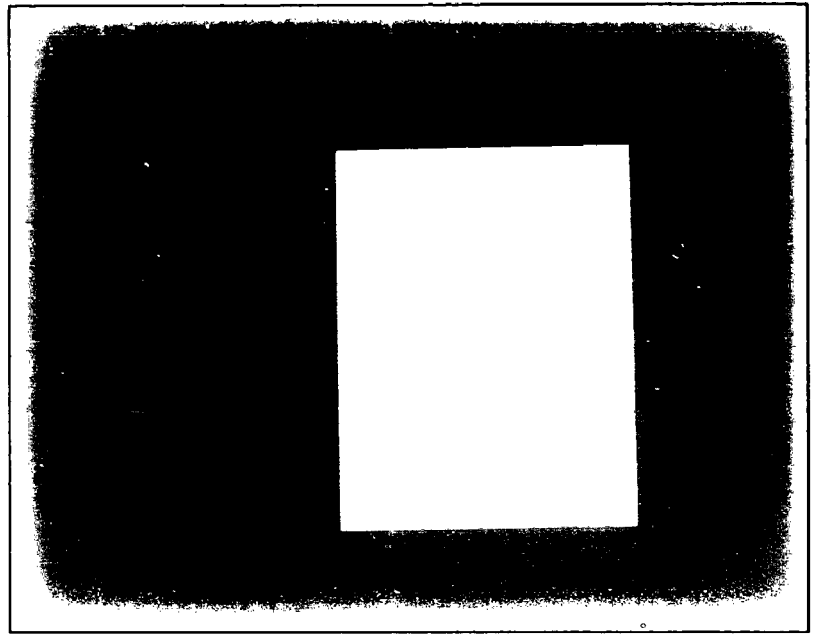
FIGS. 11A and 11B are diagrams comparing a display condition of a display device manufactured according to the present invention and the one of a display device manufactured according to the conventional technique.
Figure 11B:
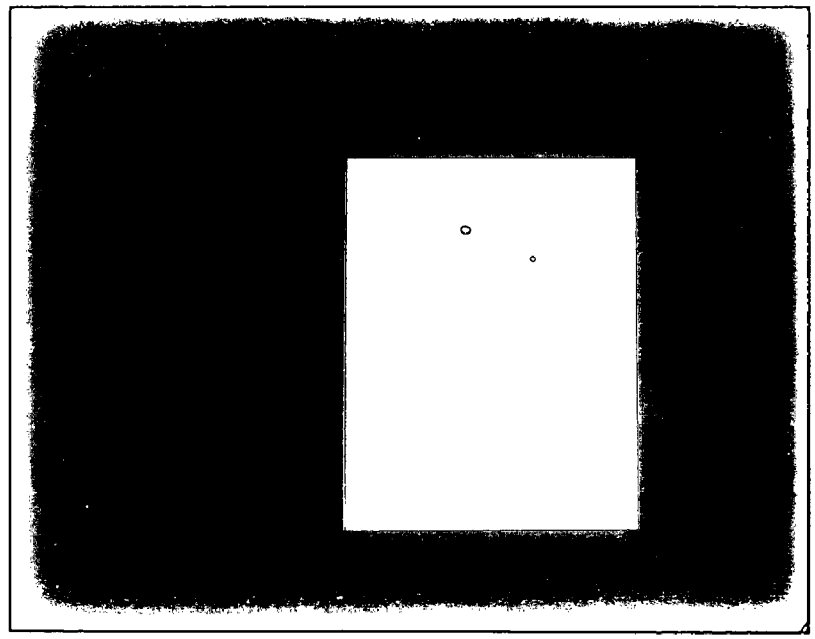

FIG. 11A is a photograph diagram which shows a display image of the light emitting device manufactured according to the present invention. FIG. 11B is a photograph diagram which shows a display image of a light emitting device manufactured according to the conventional technique. A display image is displayed and inputted with an electric signal so as to obtain single brightness and single color all the times. In addition, the image is displayed in a dark room and photographed.

According to FIGS. 11A and 11B, it can be seen that display unevenness of a striped pattern is generated in the display image manufactured by the conventional technique; however, the display unevenness is eliminated in the display image manufactured according to the present invention.

In the display device, display unevenness of the striped pattern occurred due to the variation of laser beam irradiation intensity in particular can be reduced.

Embodiment 2

In the present embodiment, electronic apparatuses manufactured according to the present invention are described. According to the present invention, electronic apparatuses equipped with a display device which displays a favorable image without display unevenness can be provided.

Figure 12A:
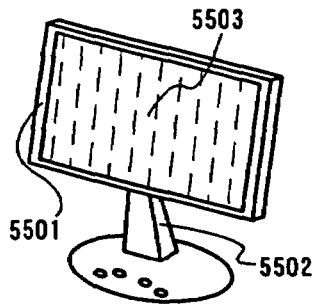
FIGS. 12A to 12F are diagrams of the electronic apparatuses to which the present invention is applied.

FIG. 12A is a display device which comprises a case 5501, a support medium 5502, and a display portion 5503. The present invention can be applied to the display device having the display portion 5503.

Figure 12B:
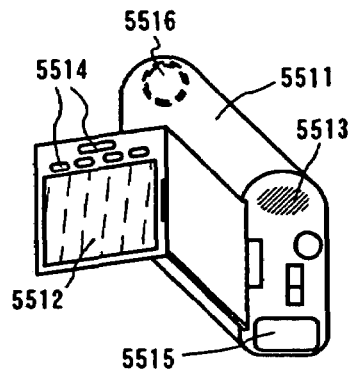

FIG. 12B is a video camera which comprises a main body 5511, a display portion 5512, a voice input portion 5513, operation switches 5514, a battery 5515, an image receiving portion 5516, and the like.

Figure 12C:
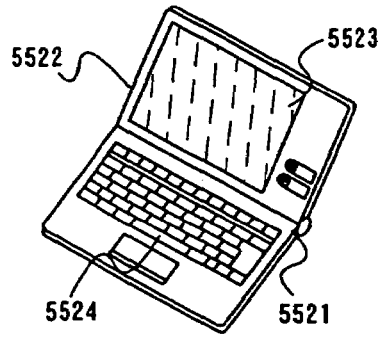

FIG. 12C is a notebook computer which comprises a main body 5501, a case 5502, a display portion 5503, a keyboard 5504 and the like.

Figure 12D:
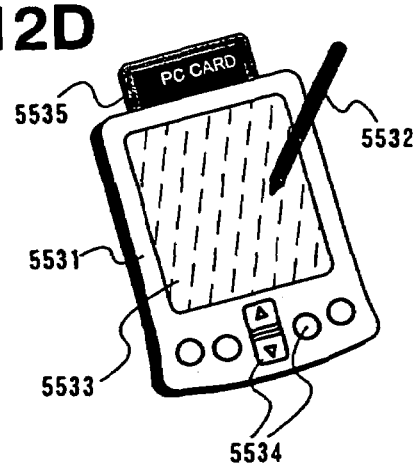

FIG. 12D is a Personal Digital Assistant (PDA) which comprises a main body 5531 including a display portion 5532, an external interface 5535, operation switches 5534 and the like. Further, the PDA comprises a stylus 5532 as the attachment for the operation.

Figure 12E:
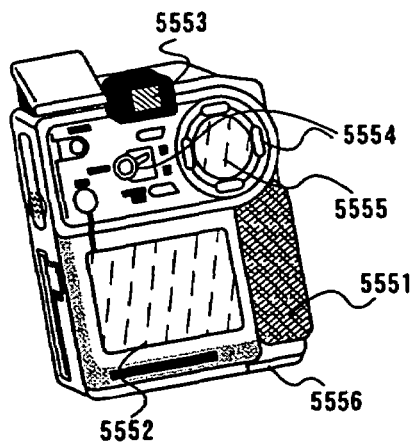

FIG. 12E is a digital camera which comprises a main body 5551, a display portion A 5552, an eye piece 5553, an operation switches 5554, a display portion B 5555, a battery 5556 and the like.

Figure 12F:
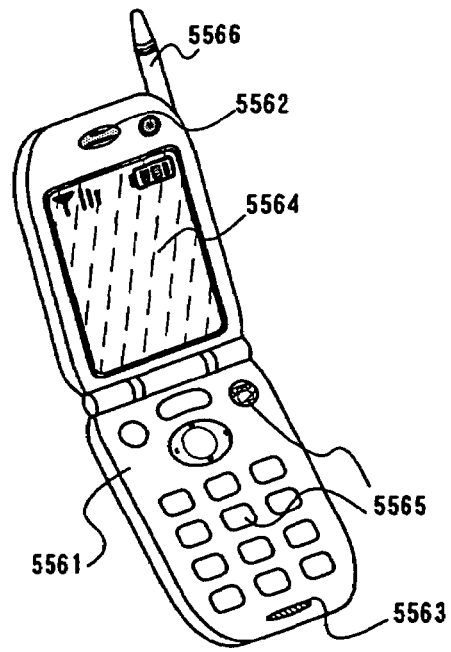

FIG. 12F is a cellular phone which comprises a main body 5561 including a display portion 5564, a voice output portion 5562, operation switches 5565, antenna 5566, and the like.

According to the present invention, the display unevenness of the striped pattern which is generated due to the variation in irradiation intensity of a laser beam can be reduced.

What is claimed is:

1. A display device comprising plural pixels, at least one of the plural pixels comprising:
    a light emitting element;
    a first thin film transistor, a second thin film transistor, and a third thin film transistor;
    a first gate signal line, and a second gate signal line, a source signal line, and a current supply line,
    wherein a gate of the first thin film transistor is electrically connected to the first gate signal line and a second terminal of the third thin film transistor,
    wherein a first terminal of the first thin film transistor is electrically connected to the source signal line,
    wherein a second terminal of the first thin film transistor is electrically connected to a gate of the second thin film transistor and a first terminal of the third thin film transistor,
    wherein a first terminal of the second thin film transistor is electrically connected to the current supply line,
    wherein a second terminal of the second thin film transistor is electrically connected to the light emitting element,
    wherein a second terminal of the third thin film transistor is electrically connected to the first gate signal line,
    wherein a gate of the third thin film transistor is electrically connected to the second gate signal line, and
    wherein a channel of the second thin film transistor is folded and orients in a plurality of directions.

2. A display device according to claim 1,
    wherein a channel length of the second thin film transistor is at least 5 times as long as a gate width of the second thin film transistor.

3. A display device according to claim 1,
    wherein the second thin film transistor comprises a semiconductor layer which is formed by irradiating with a pulsed laser beam.

4. An electronic device having the display device according to claim 1,
    wherein the electronic device is selected from the group consisting of a display device, a video camera, a notebook computer, a personal digital assistant, a digital still camera, and a mobile telephone.

5. The display device according to claim 1,
    wherein the first thin film transistor is an N-channel thin film transistor,
    wherein the second thin film transistor is a P-channel thin film transistor, and
    wherein the third thin film transistor is an N-channel thin film transistor.

6. A display device comprising plural pixels, at least one of the plural pixels comprising;
    a light emitting element
    a first thin film transistor, a second thin film transistor, and a third thin film transistor;
    a first gate signal line, and a second gate signal line, a source signal line, and a current supply line,
    wherein a gate of the first thin film transistor is electrically connected to the first gate signal line and a second terminal of the third thin film transistor,
    wherein a first terminal of the first thin film transistor is electrically connected to the source signal line,
    wherein a second terminal of the first thin film transistor is electrically connected to a gate of the second thin film transistor and a first terminal of the third thin film transistor,
    wherein a first terminal of the second thin film transistor is electrically connected to the current supply line,
    wherein a second terminal of the second thin film transistor is electrically connected to the light emitting element,
    wherein a second terminal of the third thin film transistor is electrically connected to the first gate signal line,
    wherein a gate of the third thin film transistor is electrically connected to the second gate signal line, and
    wherein a channel of the second thin film transistor is folded and orients in a plurality of directions, and wherein brightness of the light emitting element is arranged to be fluctuated depending on an ON current value in a saturation region of a drain-voltage-drain current characteristic of the second thin film transistor.

7. A display device according to claim 6, wherein a channel length of the second thin film transistor is at least 5 times as long as a gate width of the second thin film transistor.

8. A display device according to claim 6,
wherein the second thin film transistor comprises a semiconductor layer which is formed by irradiating with a pulsed laser beam.

9. An electronic device having the display device according to claim 6,
wherein the electronic device is selected from the group consisting of a display device, a video camera, a notebook computer, a personal digital assistant, a digital still camera, and a mobile telephone.

10. The display device according to claim 6,
wherein the first thin film transistor is an N-channel thin film transistor,
wherein the second thin film transistor is a P-channel thin film transistor, and
wherein the third thin film transistor is an N-channel thin film transistor.

11. A display device comprising plural pixels including:
a driving thin film transistor, a switching thin film transistor, an erasing thin film transistor, a light emitting element which is connected to a second terminal of the driving thin film transistor; and
a first gate signal line, and a second gate signal line, a source signal line, and a current supply line,
wherein a gate of the switching thin film transistor is electrically connected to the first gate signal line and a second terminal of the erasing thin film transistor,
wherein a first terminal of the switching thin film transistor is electrically connected to the source signal line,
wherein a second terminal of the switching thin film transistor is electrically connected to a gate of the driving thin film transistor and a first terminal of the erasing thin film transistor,
wherein a first terminal of the driving thin film transistor is electrically connected to the current supply line,
wherein a second terminal of the erasing thin film transistor is electrically connected to the first gate signal line,
wherein a gate of the erasing thin film transistor is electrically connected to the second gate signal line, and
wherein a channel of the driving thin film transistor is folded and orients in a plurality of directions.

12. A display device according to claim 11,
wherein a channel length of the driving thin film transistor is at least 5 times as long as a gate width of the driving thin film transistor.

13. A display device according to claim 11,
wherein the driving thin film transistor comprises a semiconductor layer formed by irradiating with a pulsed laser beam.

14. An electronic device having the display device according to claim 11,
wherein the electronic device is selected from the group consisting of a display device, a video camera, a notebook computer, a personal digital assistant, a digital still camera, and a cellular phone.

15. The display device according to claim 11,
wherein the switching thin film transistor is an N-channel thin film transistor,
wherein the driving thin film transistor is a P-channel thin film transistor, and
wherein the erasing thin film transistor is an N-channel thin film transistor.

16. A cellular phone comprising a main body, a display portion, a voice output portion, an operation switch, and an antenna,
wherein the display portion comprises plural pixels,
wherein at least one of the plural pixels includes a light emitting element, a first thin film transistor, a second thin film transistor, a third thin film transistor, a first gate signal line, a second gate signal line, a source signal line, and a current supply line,
wherein a gate of the first thin film transistor is electrically connected to the first gate signal line and a second terminal of the third thin film transistor,
wherein a first terminal of the first thin film transistor is electrically connected to the source signal line,
wherein a second terminal of the first thin film transistor is electrically connected to a gate of the second thin film transistor and a first terminal of the third thin film transistor,
wherein a first terminal of the second thin film transistor is electrically connected to the current supply line,
wherein a second terminal of the second thin film transistor is electrically connected to the light emitting element,
wherein a second terminal of the third thin film transistor is electrically connected to the first gate signal line,
wherein a gate of the third thin film transistor is electrically connected to the second gate signal line, and
wherein a channel of the second thin film transistor is folded and orients in a plurality of directions.

17. The cellular phone according to claim 16,
wherein the first thin film transistor is an N-channel thin film transistor,
wherein the second thin film transistor is a P-channel thin film transistor, and
wherein the third thin film transistor is an N-channel thin film transistor.

18. A notebook computer comprising a main body, a case, a display portion, and a keyboard,
wherein the display portion comprises plural pixels,
wherein at least one of the plural pixels includes a light emitting element,
a first thin film transistor, a second thin film transistor, a third thin film transistor, a first gate signal line, a second gate signal line, a source signal line, and a current supply line,
wherein a gate of the first thin film transistor is electrically connected to the first gate signal line and a second terminal of the third thin film transistor,
wherein a first terminal of the first thin film transistor is electrically connected to the source signal line,
wherein a second terminal of the first thin film transistor is electrically connected to a gate of the second thin film transistor and a first terminal of the third thin film transistor,
wherein a first terminal of the second thin film transistor is electrically connected to the current supply line,
wherein a second terminal of the second thin film transistor is electrically connected to the light emitting element,
wherein a second terminal of the third thin film transistor is electrically connected to the first gate signal line,
wherein a gate of the third thin film transistor is electrically connected to the second gate signal line, and
wherein a channel of the second thin film transistor is folded and orients in a plurality of directions.

19. The notebook computer according to claim 18,
wherein the first thin film transistor is an N-channel thin film transistor,
wherein the second thin film transistor is a P-channel thin film transistor, and
wherein the third thin film transistor is an N-channel thin film transistor.

20. A semiconductor device comprising plural pixels, at least one of the plural pixels comprising:
a light emitting element;
a first thin film transistor, a second thin film transistor, and a third thin film transistor;
a first gate signal line, and a second gate signal line, a source signal line, and a current supply line,
wherein a gate of the first thin film transistor is electrically connected to the first gate signal line and a second terminal of the third thin film transistor,
wherein a first terminal of the first thin film transistor is electrically connected to the source signal line,
wherein a second terminal of the first thin film transistor is electrically connected to a gate of the second thin film transistor and a first terminal of the third thin film transistor,
wherein a first terminal of the second thin film transistor is electrically connected to the current supply line,
wherein a second terminal of the second thin film transistor is electrically connected to the light emitting element,
wherein a second terminal of the third thin film transistor is electrically connected to the first gate signal line,
wherein a gate of the third thin film transistor is electrically connected to the second gate signal line, and
wherein a channel of the second thin film transistor is folded and orients in a plurality of directions.

21. An electronic device having the semiconductor device according to claim 20,
wherein said electronic device is selected from the group consisting of a display device, a video camera, a notebook computer, a personal digital assistant, a digital still camera, and a cellular phone.

22. The semiconductor device according to claim 20,
wherein the first thin film transistor is an N-channel thin film transistor,
wherein the second thin film transistor is a P-channel thin film transistor, and
wherein the third thin film transistor is an N-channel thin film transistor.

* * * * *

UNITED STATES PATENT AND TRADEMARK OFFICE
CERTIFICATE OF CORRECTION

| | | |
|---|---|---|
| PATENT NO. | : 7,589,698 B2 | Page 1 of 1 |
| APPLICATION NO. | : 10/801542 | |
| DATED | : September 15, 2009 | |
| INVENTOR(S) | : Osame et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 855 days.

Signed and Sealed this

Twenty-first Day of September, 2010

David J. Kappos
*Director of the United States Patent and Trademark Office*